United States Patent [19]
Staszewski

[11] Patent Number: 5,376,847
[45] Date of Patent: Dec. 27, 1994

[54] PHASE DETECTOR AND METHODOLOGY

[75] Inventor: Robert B. Staszewski, Richardson, Tex.

[73] Assignee: Alcatel Network Systems, Inc., Richardson, Tex.

[21] Appl. No.: 998,474

[22] Filed: Dec. 30, 1992

[51] Int. Cl.$^5$ .................. H03K 9/06; G01R 25/00
[52] U.S. Cl. ........................ 327/12; 327/3; 327/24
[58] Field of Search ............... 307/510, 511, 514, 527, 307/262; 328/133, 134; 340/146.2

[56] References Cited

U.S. PATENT DOCUMENTS

| | | | |
|---|---|---|---|
| 4,237,423 | 12/1980 | Rhodes | 328/133 |
| 4,354,124 | 10/1982 | Shima et al. | 328/133 |
| 4,451,794 | 5/1984 | Yamada | 328/134 |
| 4,851,784 | 7/1989 | Wells et al. | 328/133 |
| 5,059,833 | 10/1991 | Fujii | 307/510 |
| 5,124,594 | 6/1992 | Nuwata et al. | 328/133 |

*Primary Examiner*—Timothy P. Callahan
*Assistant Examiner*—Toan Tran
*Attorney, Agent, or Firm*—Vinson & Elkins

[57] ABSTRACT

In one embodiment, a method of providing phase detection from a circuit having first and second inputs and at least one output is disclosed. The method includes a cyclical operation of four steps. The first step awaits the receipt at the first input of an input signal which at least meets the requirements of one of two given binary values. The second step awaits the receipt at the first input of an input signal which at least meets the requirements of the other of the two given binary values before providing an output signal of a first value at the output. The third step awaits the receipt at the second input of an input signal which at least meets the requirements of one of two given binary values. The fourth step awaits the receipt at the second input of an input signal which at least meets the requirements of the other of the two given binary values before changing the output signal at the output to a second value. The process then returns to the first step. Apparatus in accordance with the inventive method are also described, including preferred TTL and CMOS logic diagrams for implementing a four state machine.

9 Claims, 3 Drawing Sheets

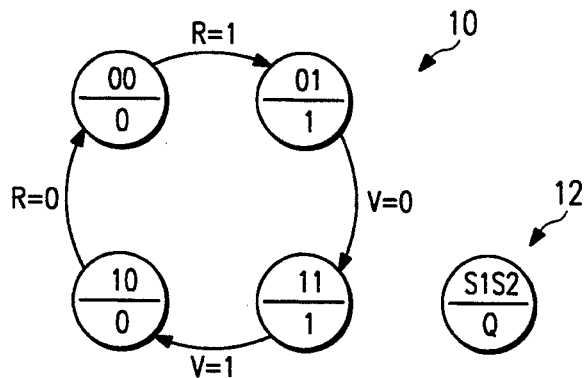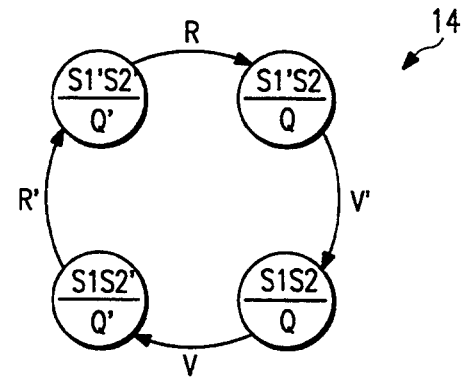
*FIG. 3a*  *FIG. 3b*
*FIG. 4*

PHASE DETECTOR AND METHODOLOGY

This invention relates in general to phase detecting circuitry, and more particularly to an improved phase detector implementing a four-state, level-triggered detection scheme.

BACKGROUND OF THE INVENTION

Phase detectors have been long used in the art for various applications. One primary application of the phase detection is a phase-locked loop ("PLL"). Typically, a PLL includes a phase detector, a low pass filter, and a voltage controlled oscillator ("VCO"). The phase detector compares the phase of an incoming signal with that of the VCO, and outputs a periodic signal having a duty cycle proportional to the phase difference between the incoming signal and the VCO. The output periodic signal is filtered to achieve a mean DC voltage which adjusts the frequency of the VCO to track that of the incoming signal. One common application of the PLL is a high-Q resonant filter.

FIG. 1a illustrates a timing diagram of an ideal characteristic for a phase detector having two inputs, R and V, and an output, Q. For this detector, the output signal, Q, is triggered by the rising edges of the input signals, R and V. Specifically, Q goes high on a rising edge of R and goes low on a rising edge of V. The resultant timing characteristic of Q may be filtered over time to generate a mean DC voltage. The amplitude of this DC voltage is, therefore, proportional to the phase difference between input signals R and V.

FIG. 1b illustrates a state diagram corresponding to the timing diagram of FIG. 1a. As appreciated from FIG. 1b, the state diagram has only two states, a first for Q=0 and a second for Q=1. Moreover, the sole criteria for switching between the two states are the rising edges of R and V. Thus, as R goes high, the output Q goes high regardless of whether R then goes low. Similarly, as V goes high, the output Q goes low regardless of whether V then goes low.

While the timing chart and state diagram of FIGS. 1a-1b provide optimal results in theory, they do not address an anomaly which arises once implemented in hardware. Specifically, each of the two-state changes occurs only after a finite delay caused by the circuitry implementing the phase detector. This delay is caused by the propagation delays within the various logic gates or components of the phase detector. Consequently, the more complicated the device componentry, the greater risk of delay and the greater deviation from the desired effects illustrated in FIGS. 1a and 1b.

FIG. 2 illustrates a non-linear, or "dead zone", effect known in the art of phase detectors. Particularly, FIG. 2 illustrates a graph of the DC average of a phase detector output versus the phase difference between the phase detector inputs. Ideally, the DC average output of the phase detector should be linearly proportional to the phase difference between the detector inputs. As shown in FIG. 2, however, a significant range of non-linearity is created where the phase difference of the input signals approaches zero degrees.

The non-linearity of FIG. 2 is caused by the propagation delays imposed by the phase detection circuitry. Specifically, the absolute delay of the individual gates, the gate-to-gate variation in delays, and the transition dependence of the delay all contribute to the non-linearity. The non-linearity causes jitter in the detector output, and limits its operating frequency range. Ironically, most PLLs are implemented to operate in the middle of the DC output range of the phase detector (e.g., where the phase difference between the input signal and the VCO output approaches zero). Thus, these PLLs operate in precisely the area of the dead zone. Consequently, the non-linear response is most problematic for many typical operations of the PLL. Moreover, the dead zone is not repeatable and, hence, not predictable; nor is it commonly characterized on a phase detector data sheet. Instead, it is at best a probabilistic function which varies with at least temperature, time and operating environment.

Various remedies have been attempted to reduce the problems created by the dead zone. One known approach is moving the dead zone by injecting a controlled amount of DC or pulsed offset voltage. This attempt, however, increases circuit complexity and decreases performance. Additional circuitry raises power requirements. Further, the added circuitry often significantly reduces the frequency response range of the device. Still further, additional circuitry may create timing hazards, that is, functional timing requirements which if not met, produce device lock up or erroneous results. Finally, moving the dead zone does not reduce the problem, it merely shifts it to a less common operating area for a PLL.

It is therefore an object of the present invention to provide a method and apparatus for detecting a difference in phase between two signals with reduced propagation delay.

It is further object of the present invention to provide such a method and apparatus for providing a linear response curve when the phase difference lies in the vicinity of 180°.

It is further object of the present invention to provide such a method and apparatus for reducing the number of components in a phase detector.

It is further object of the present invention to provide such a method and apparatus for reducing the power consumption in a phase detector.

It is further object of the present invention to provide such a method and apparatus for providing a TTL-compatible phase detector.

It is further object of the present invention to provide such a method and apparatus for providing a CMOS-compatible phase detector.

Still other objects and advantages of the present invention will become apparent to those of ordinary skill in the art having reference to the following specification together with its drawings.

SUMMARY OF THE INVENTION

In one embodiment, the present invention includes a method of providing phase detection from a circuit having first and second inputs and at least one output. The method includes a cyclical operation of four steps. The first step awaits the receipt of an input signal at the first input which at least meets the requirements of one of two given binary values. The second step awaits the receipt of an input signal at the first input which at least meets the requirements of the other of the two given binary values before providing an output signal of a first value at the output. The third step awaits the receipt of an input signal at the second input which at least meets the requirements of one of two given binary values. The fourth step awaits the receipt of an input signal at the second input which at least meets the requirements of the other of the two given binary values before changing the output signal at the output to a second value. The process then returns to the first step. Apparatus in accordance with the inventive method are also described.

BRIEF DESCRIPTION OF THE DRAWINGS

For a more complete understanding of the present invention, and the advantages thereof, reference is now made to the following descriptions taken in conjunction with the accompanying drawings, in which:

FIG. 3a illustrates a state diagram for a phase detector in accordance with the present invention;

FIG. 3b illustrates a state diagram of the preferred embodiment of the present invention;

FIG. 4 illustrates the Karnaugh maps for deriving logic equations for implementing the state diagram shown in FIG. 3a;

FIG. 5a illustrates a logic diagram for implementing the state diagram of FIG. 3a;

DETAILED DESCRIPTION OF THE INVENTION

Figure 1A:
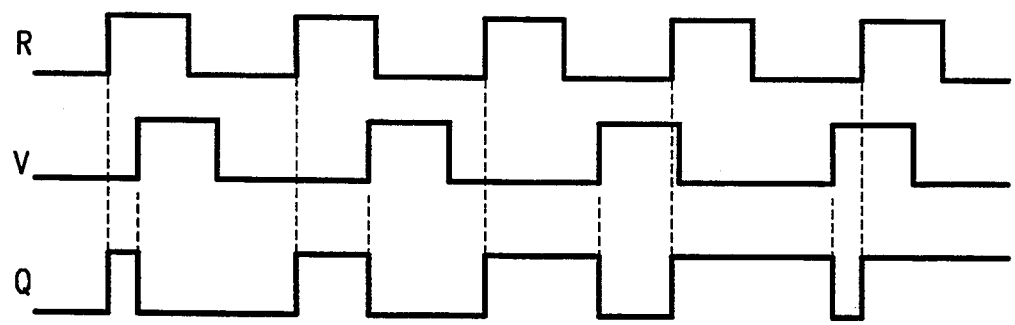
FIG. 1a illustrates a timing diagram of an ideal characteristic for a phase detector having two inputs and an output.
Figure 1B:
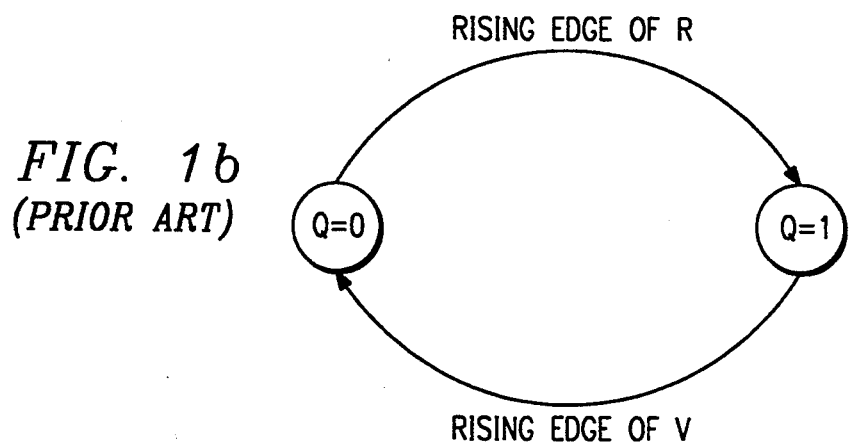
FIG. 1b illustrates a state diagram for a prior art phase detector.
Figure 2:
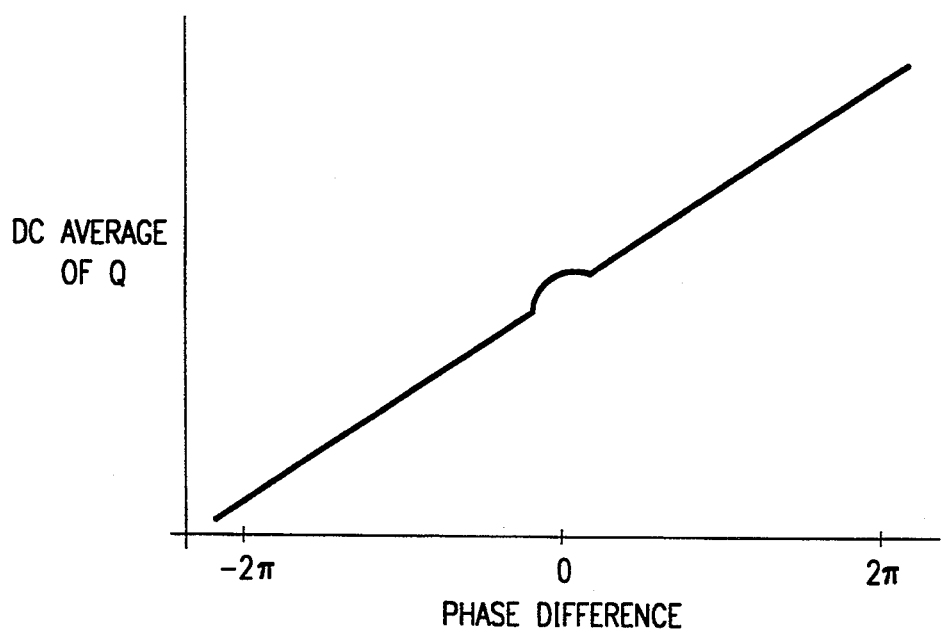
FIG. 2 illustrates the dead zone of a prior art phase detector in a graph of the DC average of a phase detector output versus the phase difference between the detector inputs.

The preferred embodiment of the present invention and its advantages are best understood by referring to FIGS. 1a–5 of the drawings, like numerals being used for like and corresponding parts of the various drawings.

FIG. 3a illustrates a state diagram designated generally at 10, and for defining the states of operation for a phase detector in accordance with the present invention. Specifically, state diagram 10 illustrates a state machine having inputs R and V, an output Q, and four states 00, 01, 11 and 10, each represented in binary form with bits S1 and S2. Accordingly, as shown by a legend 12, each circle within state diagram 10 includes a designation of the state bits, S1 and S2, as well as the output value, Q, for the phase detector. It should be noted that the identifiers "R" and "V" are chosen to conform with labels typically used in the PLL art, but in no way should limit the application of the present invention.

The operation of a phase detector in accordance with state diagram 10 is as follows. Upon start-up, the phase detector enters one of the four states of diagram 10. For purposes of example, this discussion commences with state S1S2=00. In state S1S2=00, the output of the phase detector, Q, is low. The phase detector remains in state S1S2=00 until input R reaches a high level. Note that activity of input V during state S1S2=00 does not affect state machine 10. In addition, note the transition from state S1S2=00 to state S1S2=01 preferably occurs only once input R fully changes in binary level. Thus, the present invention is preferably level-triggered as opposed to transition-triggered as discussed above in connection with the prior art.

Once input R reaches a high level the phase detector switches to state S1S2=01. In state S1S2=01, the output of the phase detector, Q goes high. The phase detector then remains in state S1S2=01 until the second input, V, reaches a low level. Note that activity of input R during state S1S2=01 does not affect state machine 10. In addition, the transition from state S1S2=01 to state S1S2=11 preferably occurs only once input V fully changes in binary level, rather than on the transition edge of input V.

Once input V reaches a low level, the phase detector switches to state S1S2=11. In state S1S2=11, the Q output of the phase detector remains high. The phase detector then remains in state S1S2=11 until the second input, V, reaches a high level. Note that activity of input R during state S1S2=11 does not affect state machine 10. Once again, the transition from state S1S2=11 to state S1S2=10 preferably occurs only once input V fully changes in binary level, rather than on the transition edge of input V.

Once input V reaches a high level, the phase detector switches to state S1S2=10. In state S1S2=10, the Q output of the phase detector switches low. The phase detector then remains in state S1S2=10 until the first input, R, reaches a low level. At this point, and again on a full level change of R, the edge detector returns to state S1S2=00. From state S1S2=00, the process cycles in unidirectional fashion around timing diagram 10 as discussed above.

From the above, it should be appreciated that state machine 10 of FIG. 3a produces an output signal, Q, which will have a duty cycle proportional to the phase difference between inputs Q and V. Moreover, the DC average of this output is lowest when the phase difference approaches zero, and highest when the phase difference approaches 360°. Recall that a PLL typically functions near the middle of its dectector's DC output range. Thus, a PLL implementing a phase detector in accordance with the present invention will typically operate at a phase difference on the order of 180°. At 180°, the response curve of the present invention is linear rather than having potential non-linearities which may occur near phase differences of 0° or 360°. Thus, the present invention also provides operation at a phase difference away from a non-linear response of the phase detector. Consequently, the effects of the dead zone are virtually eliminated.

FIG. 3b illustrates a state diagram 14 of the preferred embodiment of the present invention. State diagram 14 of FIG. 3b is similar to that of FIG. 3a, but demonstrates that the present invention need not be limited to the absolute values imposed by FIG. 3a. Specifically, as shown in FIG. 3b, the values of inputs R and V, output Q, and state bits S1 and S2, need only change as complements with respect to one another. Moreover, although not illustrated, the order of analysis also may change; that is, V could precede R. Thus, the four-state machine 10 of FIG. 3a can be recharacterized as in FIG. 3b. Finally, note that the notation of an apostrophe in the Figures and throughout this document suggests the logical complement of a signal without an apostrophe. For example, R' is the logical complement of R.

State machine 14 commences operation in a first state. This first state may be any of the four states shown in FIG. 3b. For purposes of example, consider the instance where state machine 14 begins operating in state S1'S2'.

Thereafter, state machine 14 switches to state S1'S2 once input R is in a full magnitude. Note that the term "full magnitude" is used here to mean fully either a logical 0 or 1, depending solely on the predetermined definition for an input signal. Consequently, if R' is predefined as equal to 1, then R equals 0, and the switch from state S1'S2' occurs only when input R is fully low. In state S1'S2, the output of the phase detector also switches to its complement (e.g., from value Q' to value Q).

From state S1'S2, state machine 14 switches to state S1S2 once the opposing input signal (i.e., the signal which did not just cause the previous transition to S1'S2) is at a full magnitude; that is, either fully low or fully high. Since input R caused the previous transition, input V causes the transition to S1S2. Thus, state machine 14 switches from S1'S2 to S1S2 depending on the arbitrary value predetermined for V'.

Once in state S1S2, state machine 14 switches to state S1S2' only when the input signal which was just analyzed (i.e., input V) reaches a full magnitude opposite that which caused the transition from S1'S2 to S1S2. Thus, if V' is assigned as equal to 0, then state machine 14 switches from S1'S2 to S1S2 when V'=0, and switches from S1S2 to S1S2' when V=1.

Lastly, from state S1S2', state machine 14 returns to state S1'S2' once the input which caused the initial state transition (i.e., the input which caused the transition from S1'S2' to S1'S2) is at a full magnitude opposite that which caused the original state transition. Thus, in the present example, the R input caused the transition from S1'S2' to S1'S2. Moreover, this change occurred when R reached a fully low level. Consequently, the return to state S1'S2' occurs only when input R is at the opposite level and, hence, occurs in the current example when R is fully high.

Note that the value assigned to R' need not correspond to that of V'. Thus, in the current example where R' equals 1, V' could equal 0. Accordingly, the pattern of state transition dependency on one input (e.g., R reaching low causes first transition, subsequently, R reaching high causes successive transition) could be opposite that of the other input (e.g., V reaching high causes first transition, subsequently V reaching low causes successive transition).

From the above, it may be appreciated that the state machine of the present invention can be characterized as having four states, with a change in state occurring depending on the full magnitude of one of the two phase detector input signals. The particular input signal causing the transition given a particular state depends on the input signal which caused the immediately preceding transitions. Thus, given a sequence of state changes identifiable as one, two and three, consider the following. For change three, the input signal other than that which caused changes one and two is used if the same input signal was analyzed to cause changes one and two. For example, in state diagram 14, consider the transition from S1S2' to S1'S2' as change three. For the two prior state changes, the same input signal (i.e., V) was analyzed to cause the changes. Thus, for change three, the opposite input signal (i.e., R) is used. If, however, changes one and two were caused by opposite input signals, then change three occurs in response to the same input signal which caused change two. For example, in state diagram 14, consider the transition from S1S2 to S1S2' as change three. For the two prior state changes, opposite input signals were analyzed to cause the changes (first, input R was used from S1'S2' to S1'S2 and, second, input signal V was used from S1'S2 to S1S2). Thus, for change three, the same input signal just analyzed (i.e., input signal V) is again analyzed for state change three.

FIG. 4 illustrates three Karnaugh maps known in the art for generating logic equations. Specifically, the maps of FIG. 4 are drawn to match the states of the state diagram embodiment of FIG. 3a. From FIG. 4, therefore, the state equations defining the two bits (i.e., S1 and S2) necessary to support the four-state machine are:

$$S1(next) = S1(R+S2) + V \cdot S2 \qquad \text{Eqn. 1}$$

$$S2(next) = S1'(R+S2) + V \cdot S2 \qquad \text{Eqn. 2}$$

Figure 5C:
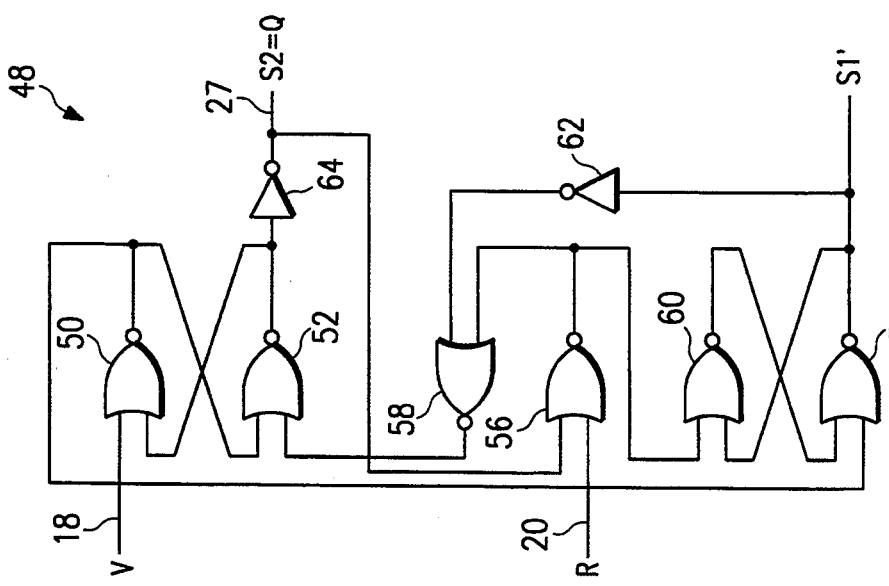
FIG. 5c illustrates an alternative logic diagram to the diagram of FIG. 5a, wherein the alternative is preferable for implementation using CMOS logic circuitry.
Figure 5B:
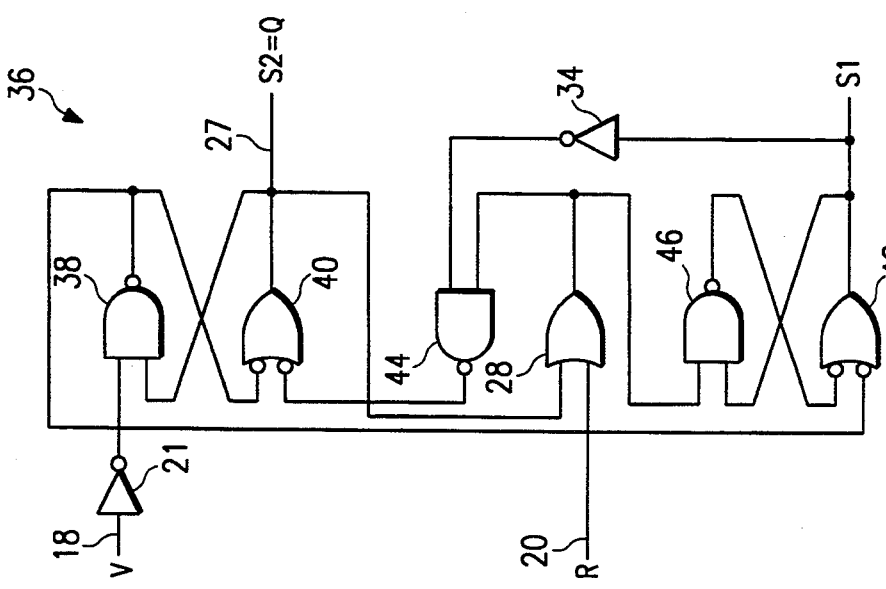
FIG. 5b illustrates an alternative logic diagram to the diagram of FIG. 5a, wherein the alternative is preferable for implementation using TTL logic circuitry.
Figure 5A:
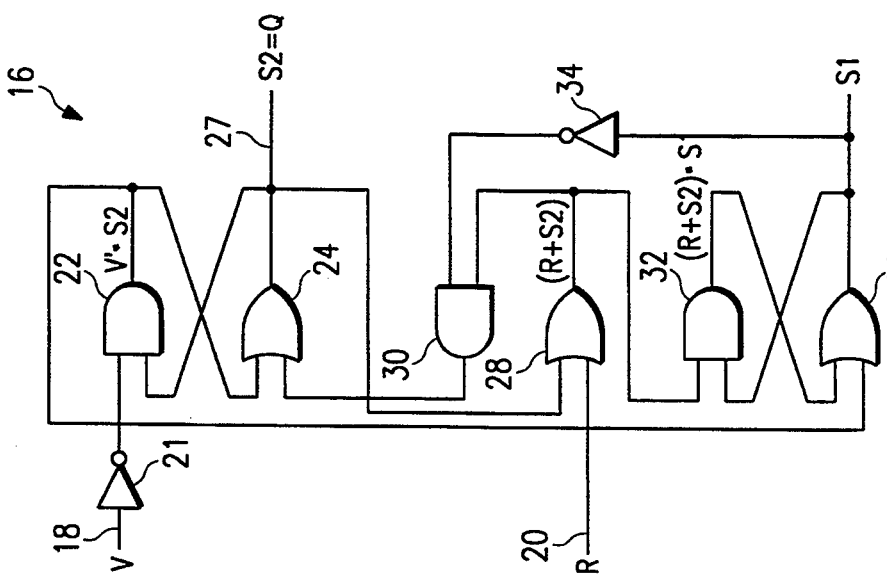

FIG. 5a illustrates a preferred logic circuit indicated generally at 16 and implementing Equations 1 and 2 derived above. Circuit 16 has two inputs 18 and 20 for receiving signals V and R, respectively. Input 18 is connected through an inverter 21 to a first input of an AND gate 22. The output of AND gate 22 is connected to a first input of an OR gate 24, and also to a first input of an OR gate 26. The output of OR gate 24 is connected to an output 27 for circuit 16. Output 27 provides the S2 state bit for circuit 16 which is also equal to the output signal, Q, for the circuit. The S2 state bit is also connected to a second input of AND gate 22, and to a first input of an OR gate 28.

Input 20 of circuit 16 is connected to the second input of OR gate 28. The output of OR gate 28 is connected to a first input of an AND gate 30, and to a first input of an AND gate 32. The output of AND gate 30 is connected to a second input of OR gate 24. The output of AND gate 32 is connected to a second input of OR gate 26. The output of OR gate 26 is connected to a node which provides the S1 state bit for circuit 16. Moreover, the output of OR gate 26 is connected through an inverter 34 to the second input of AND gate 30. Finally, the output of OR gate 26 is also connected to a second input of AND gate 32.

The various gate outputs of circuit 16 are shown in FIG. 5a. For example, AND gate 22 provides an output equal to V'·S2. By tracing the various signal paths and outputs of FIG. 5a, one skilled in the art may readily appreciate that circuit 16 performs logical Equations 1 and 2 set forth above. Thus, a phase detector in accordance with the present invention may be constructed having only eight one- or two-input logic gates. This should be contrasted with prior art phase detectors, such as the MOTOROLA MC4044, which often require much more complicated gate structures (e.g., gates having more than two inputs). Moreover, the longest signal path from input to output is three gates, thereby providing a maximum propagation delay of only three gate delays. As a result, the present invention provides for greatly reduced delay as compared to phase detectors known in the art. Moreover, reducing the number of gates reduces the amount of power required by the circuit. Still further, the faster the circuit, the greater its operational frequency. Finally, the present invention virtually eliminates the dead zone effects described in FIG. 2, above.

While FIG. 5a illustrates one embodiment under the present invention, FIG. 5b illustrates an alternative circuit under the present invention and designated at 36. Circuit 36 is preferable when implementing the present invention using TTL logic. As known in the TTL art, efficiencies are maximized in TTL logic when NAND gates are implemented. Accordingly, by using known bubble to bubble design techniques, circuit 16 of FIG. 5a may be converted to circuit 36 of FIG. 5b.

In FIG. 5b, different reference numerals are used where the bubble to bubble conversion has caused a change in gate type. Thus, while inverters 21 and 34, as well as OR gate 28, remain the same, the remainder of the gates from FIG. 5a all convert to NAND gates (noting that, as known in the art, an OR gate having inverted inputs is equivalent to a NAND gate). Consequently, gates 22, 24, 26, 30 and 32 of FIG. 5a are all replaced in FIG. 5b with NAND gates 38, 40, 42, 44 and 46, respectively. The resultant operation of circuit 36, therefore, operates to produce the same state transitions as the circuitry of FIG. 5a, and as shown in FIG. 3a.

In addition to the TTL-compatible circuit of FIG. 5b, FIG. 5c illustrates yet another alternative circuit 48 in accordance with the present invention. Specifically, circuit 48 is preferable when implementing the present invention using CMOS logic. As known in the art, CMOS logic is commonly implemented when constructing ASICs (application specific integrated circuits). Thus, an ASIC requiring a phase detector could implement the componentry of FIG. 5c.

The gates of FIG. 5c are also derived from FIG. 5a using known bubble to bubble design techniques. In CMOS technology, however, it is desirable to implement as many NOR gates as possible. As shown in FIG. 5c, the present invention may be implemented using entirely NOR gates and inverters. Particularly, in FIG. 5c, NOR gates 50, 52, 54, 56, 58 and 60 are substituted for gates 22, 24, 26, 28, 30 and 32, respectively, of FIG. 5a. One inverter 62 is connected between the output of NOR gate 54 and an input of NOR gate 58. The input of a second inverter 64 is connected to the output of NOR gate 52, and has its output connected to output 27 of circuit 48 and to an input of NOR gate 56. Like circuit 36, the resultant operation of circuit 48 operates to produce the same state transitions as the circuitry of FIG. 5a, and as shown in FIG. 3a. Moreover, circuit 48 uses only one type of gate other than inverters and, thus, is highly compatible with CMOS fabrication technology.

From the above, it may be appreciated that the present invention provides numerous advantages over the prior art. For example, the dead zone effect of prior phase detectors is virtually eliminated, while enhancing circuit efficiency and the range of operating frequencies. Particularly, various embodiments are discussed, including an eight gate circuit fully capable of providing an improved phase detection function. Thus, from the embodiments and advantages discussed herein, it should be appreciated that while the present invention has been described in detail, various substitutions, modifications or alterations could be made to it without departing from its scope as defined by the following claims.

What is claimed is:

1. A method of providing phase detection from a circuit having first and second inputs for receiving, respectively, a first and second binary input signal, said circuit also having at least one output, the method comprising cyclicly completing the steps of:
    (a) awaiting, in a first state, the receipt at said first input of an input signal which fully meets the requirements of one of two given binary values and proceeding to step (b) irrespective of said second input signal;
    (b) awaiting, in a second state, the receipt at said first input of an input signal which fully meets the requirements of the other of said two given binary values and, irrespective of said second input signal, providing an output signal of a first value at said output and then proceeding to step (c);
    (c) awaiting, in a third state, the receipt at said second input of an input signal which fully meets the requirements of one of two given binary values and proceeding to step (d) irrespective of said first input signal; and
    (d) awaiting, in a fourth state, the receipt at said second input of an input signal which fully meets the requirements of the other of said two given binary values and, irrespective of said second input signal, changing the output signal at said output to a second value and then proceeding to step (a) to repeat the method.

2. A method of detecting the phase difference between a first input signal and a second input signal, comprising the steps of:
    receiving said first input signal at a first input;
    receiving said second input signal at a second input; and
    performing successive transitions between four different states, wherein said performing steps comprises the steps of:
        moving from a first state to a second state in response to said first input signal comprising a first of two binary signals and irrespective of said second input signal;
        moving from said second state to a third state in response to said first input signal comprising a second of two binary signals and irrespective of said second input signal;
        moving from said third state to a fourth state in response to said second input signal comprising a first of two binary signals and irrespective of said first input signal; and
        moving from said fourth state to said first state in response to said second input signal comprising a second of two binary signals and irrespective of said first input signal.

3. The method of claim 2 wherein each of said moving steps occurs in response to the full magnitude of one of said first and second input signals.

4. An apparatus for detecting the phase difference between a first input signal and a second input signal, comprising:
    a first input for receiving said first input signal;
    a second input for receiving said second input signal; and
    a state machine coupled to said first and second inputs and having transitions between four states, said state machine comprising:
        circuitry for moving from a first state to a second state in response to said first input signal comprising a first of two binary signals and irrespective of said second input signal;
        circuitry for moving from said second state to a third state in response to said first input signal comprising a second of two binary signals and irrespective of said second input signal;
        circuitry for moving from said third state to a fourth state in response to said second input signal comprising a first of two binary signals and irrespective of said first input signal; and circuitry for moving from said fourth state to said first state in response to said second input signal comprising a second of two binary signals and irrespective of said first input signal.

5. An apparatus for detecting the phase difference between a first input signal and a second input signal, comprising:

a first input for receiving a V input signal having a first phase;

a second input for receiving an R input signal having a second phase;

a node for providing an S1 signal;

an output for providing an S2 signal having a duty cycle proportional to a difference in phase between said first phase and said second phase, wherein said S1 and S2 signal combine to indicate a state of operation; and circuitry coupled to said first and second inputs, said output and said node, wherein said circuitry operates to perform the logical function such that the next state of $S1 = S1(R+S2) + V' \cdot S2$; and circuitry coupled to said first and second inputs, said output and said node, wherein said circuitry operates to perform the logical function such that the next state of $S2 = S1'(R+S2) + V' \cdot S2$ wherein $V'$ is the logical complement of V, and $S1'$ is the logical complement of S1.

6. An apparatus for detecting the phase difference between a first input signal and a second input signal, comprising:

a first signal input for receiving a first input signal;

a first inverter having an input connected to said first signal input;

a first NAND gate having a first input connected to an output of said first inverter;

a second NAND gate having a first input connected to an output of said first NAND gate, and an output connected to a circuit output and to a second input of said first NAND gate;

a third NAND gate having a first input connected to said output of said first NAND gate and an output connected to an input of a second inverter;

a second signal input for receiving a second input signal;

an OR gate having a first input connected to said second signal input and a second input connected to said output of said second NAND gate;

a fourth NAND gate having a first input connected to an output of said OR gate, a second input connected to an output of said second inverter and an output connected to a second input of said second NAND gate; and a fifth NAND gate having a first input connected to said output of said OR gate, a second input connected to said output of said third NAND gate and an output connected to a second input of said third NAND gate.

7. The apparatus of claim 6 wherein each of said NAND gates comprises TTL circuitry.

8. The method of claim 2 wherein said first binary signal of said first recited moving step is the same as said first binary signal of said third recited moving step.

9. The method of claim 2 wherein said first binary signal of said first recited moving step is the opposite as said first binary signal of said third recited moving step.

* * * * *

UNITED STATES PATENT AND TRADEMARK OFFICE
CERTIFICATE OF CORRECTION

PATENT NO. : 5,376,847
DATED : December 27, 1994
INVENTOR(S) : Robert B. Staszewski It is certified that error appears in the above-indentified patent and that said Letters Patent is hereby corrected as shown below:

Col. 4, line 3    After level, insert --,--.

Col. 4, line 5    After Q, insert --,--.

Col. 6, line 32   Delete "output:", insert --output--.

Signed and Sealed this

Eleventh Day of April, 1995

Attest:

BRUCE LEHMAN

Attesting Officer            Commissioner of Patents and Trademarks